US 8,400,772 B2

(12) United States Patent
Hortig et al.

(10) Patent No.: US 8,400,772 B2
(45) Date of Patent: Mar. 19, 2013

(54) SUPPORT ELEMENT ARRANGEMENT AND METHOD FOR MANUFACTURING A SUPPORT ELEMENT ARRANGEMENT

(75) Inventors: Michael Hortig, Eningen (DE); Peter Kunert, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 199 days.

(21) Appl. No.: 12/734,415

(22) PCT Filed: Oct. 1, 2008

(86) PCT No.: PCT/EP2008/063148
§ 371 (c)(1),
(2), (4) Date: Aug. 25, 2010

(87) PCT Pub. No.: WO2009/056422
PCT Pub. Date: May 7, 2009

(65) Prior Publication Data
US 2010/0309637 A1 Dec. 9, 2010

(30) Foreign Application Priority Data

Nov. 2, 2007 (DE) .......................... 10 2007 052 366

(51) Int. Cl.
*H05K 7/00* (2006.01)
(52) U.S. Cl. .......................... 361/729; 361/807; 361/810
(58) Field of Classification Search .................. 361/792, 361/720, 736, 740, 748, 760, 756, 759
See application file for complete search history.

(56) References Cited

U.S. PATENT DOCUMENTS

| | | | |
|---|---|---|---|
| 2,894,241 A * | 7/1959 | McKee .......................... 439/65 |
| 3,624,587 A | 11/1971 | Conrad | |
| 5,545,924 A * | 8/1996 | Contolatis et al. ............ 257/724 |
| 6,074,231 A * | 6/2000 | Ju ................. 439/327 |
| 6,083,026 A * | 7/2000 | Trout et al. ................... 439/328 |
| 7,556,501 B2 * | 7/2009 | Morita ............................. 439/62 |
| 7,864,544 B2 * | 1/2011 | Smith et al. .................... 361/774 |
| 7,940,530 B2 * | 5/2011 | Duppong et al. ............. 361/760 |
| 2003/0114027 A1 | 6/2003 | Wurster | |
| 2006/0148280 A1 | 7/2006 | Ashman et al. | |

FOREIGN PATENT DOCUMENTS

| | | |
|---|---|---|
| DE | 27 52 665 | 5/1979 |
| EP | 0 665 438 | 8/1995 |

* cited by examiner

*Primary Examiner* — Hung S Bui
(74) *Attorney, Agent, or Firm* — Kenyon & Kenyon LLP

(57) ABSTRACT

A support element arrangement for an electronic component includes a first support element and a second support element, the first support element being configured perpendicularly to the second support element and having a first main extension plane, and, in addition, the first support element having a first recess, the first recess at least partially surrounding the second support element in the first main extension plane.

8 Claims, 2 Drawing Sheets

SUPPORT ELEMENT ARRANGEMENT AND METHOD FOR MANUFACTURING A SUPPORT ELEMENT ARRANGEMENT

BACKGROUND OF THE INVENTION

1. Field of the Invention

The present invention relates to a support element arrangement.

2. Description of Related Art

Such support element arrangements are generally known. A transducer module is known from the European patent publication EP 0 665 438 B1, for example, a chip package having a transducer chip being configured on a printed circuit board, in addition, the transducer chip being oriented perpendicularly to the circuit board surface.

BRIEF SUMMARY OF THE INVENTION

The support element arrangement according to the present invention and the method according to the present invention for manufacturing a support element arrangement have the advantage over the related art of allowing the electronic component on the second support element to be positioned vertically relative to the first main extension plane relatively simply and inexpensively in terms of manufacturing, while entailing very minimal production-induced angular deviations. In addition, the spatial requirements for the support element arrangement are significantly reduced in comparison to the related art since the second support element is at least partially surrounded by the first support element, i.e., the second support element intersects the first main extension plane, and the extent of the support element arrangement along the second support element is thus considerably smaller than under the related art. This is of crucial importance, particularly when using the support element arrangement in vehicle manufacturing, since, for the most part, the available installation spaces are comparatively small and/or have an irregularly shaped structure. In certain applications, the electronic components are to be positioned vertically relative to the first support element. For example, to measure a rotation rate in the x-/y-plane and/or to measure an acceleration in the z-axis, a rotation-rate sensor and/or an acceleration sensor must be vertically positioned relative to the first support element that is disposed in the x-/y-plane. In this case, the smaller the angular deviations are from the right angle between the sensor and the first support element, the greater is the measuring accuracy of the sensor. In addition, to vertically position the electronic component relative to the first support element, the support element arrangement according to the present invention provides for using a second support element, the first and/or the second support element preferably including printed circuit boards. Thus, a comparatively simple and inexpensive manufacturing of the support element arrangement is possible, since both the fabrication, as well as the populating of the first and second support element may be implemented using known standard manufacturing and component insertion methods. Along the lines of the present invention, the electronic component includes an electrical, an electronic and/or a microelectronic component, preferably a sensor and especially preferably a rotation-rate and/or acceleration sensor. It is very especially preferred that the electronic component be soldered directly onto the second support element which, in particular, includes a printed circuit board.

One example development provides that a module housing having the electrical, electronic and/or microelectronic component, preferably a sensor and especially preferably an acceleration and/or rotation-rate sensor, be installed on the second support element. Thus, a sensor arrangement is able to be implemented very advantageously, a rotation rate and/or an acceleration in the x-, y- and/or z-direction being measurable. Electrical, electronic and/or microelectronic components, especially acceleration and/or rotation-rate sensors, are installed very advantageously, in particular both on the first support element, as well as on the second support element, so that the components on the second support element are integrated in an electrical or electronic circuit on the first support element, and/or a rotation rate in the x-/y-plane, and/or an acceleration in parallel to the z-axis are measured by a rotation-rate and/or acceleration sensor on the second support element, while, at the same time, a rotation rate in parallel to the z-axis and/or an acceleration in the x-/y-plane are measured by a rotation-rate and/or acceleration sensor on the first support element. It is very especially preferred that the module housing include a premold or SOIC package into which the component is integrated.

Another example development provides that the first main extension plane intersect the module housing and/or the second support element, so that the extent of the support element arrangement in parallel to the second support element is advantageously further minimized. It is especially preferred that the extent be minimized in that the first main extension plane intersects the module housing and/or the second support element essentially in the center relative to the extent of the module housing and/or relative to the second support element in parallel to the second support element.

Another example development provides that the second support element be mechanically fastened by at least one fastening element, preferably a fixing bracket, to the first support element, it being especially preferred that the fastening element have at least one connecting pin that is fixed in position in a second recess of the first support element, and it being particularly preferred that the connecting pin have first pinch ribs to be non-positively and/or positively squeezed by the second recess. Installing the second support element on the first support element by way of the fastening element makes it very advantageously possible to maximize the positional accuracy of the second support element relative to the first support element and, thus, in particular to minimize the angular deviations. Thus, in particular, the measuring accuracy of sensors on the second support element is considerably enhanced over the related art. In addition, the fastening elements may be installed simply and cost-effectively by a comparatively simple, in particular pressurized insertion of the connecting pins into the second recess. It is particularly advantageous that the second recess is able to be cost-effectively produced and precisely positioned in standard processes for manufacturing printed circuit boards, so that a comparatively precise and self-locating positioning of the fastening elements is made possible. Upon squeezing of the connecting pin by the second recess, the first pinch ribs, which, in particular, include a plastic material, produce a non-positive and/or positive connection which is very preferably additionally adhesively bonded, welded and/or soldered. In particular, by using a plurality of pinch ribs, it is possible to compensate for a positional tolerance of the second recesses and/or for a positional tolerance of the pinch, ribs.

Another example development provides that the first support element have a bearing surface having at least one defined support point which is provided for receiving the fastening element in a positive-locking and/or integral manner. It is particularly beneficial that a defined placement of the support points makes it possible to adjust or prevent a corresponding tilting of the fastening element and/or to compensate for a height difference among a plurality of support points of the first support element, thereby permitting a precise adjustment of the right angle between the first and the second support element. It is also especially preferred that, by varying the height of the support point, an adhesive gap between the fastening element and the first support element is varied in the case of an adhesive bonding together of the same, and the accumulation of a desired quantity of adhesive in the adhesive gap is realized.

Another example development provides that the fastening element have a guide portion for receiving the second support element, the guide portion preferably having second pinch ribs for the non-positive and/or positive squeezing by the second support element. It is particularly advantageous that the guide portion permits a precise and, at the same time, inexpensive fitting attachment of the second support element relative to the first support element. In particular, the guide portion, which preferably has an extent parallel to the second support element, ensures a comparatively high positional accuracy of the second support element relative to the first support element, and features a substantially smaller angular deviation in comparison to the related art, so that it is especially preferred that the measuring accuracy of the sensors is considerably enhanced. In addition, the process of installing the second support element by a comparatively simple introduction or insertion of the second support element into the guide portion perpendicularly to the first main extension plane is able to be implemented relatively reliably and cost-effectively. It is especially preferred that, following introduction or insertion, the second support element is automatically fixed in position in the guide portion by a squeezing by the second pinch ribs, an additional adhesive bonding being provided, in particular.

Another example development provides that at least one electrically conductive connection be provided via a connecting element, preferably an angular contact, between the first and the second support element. Thus, an electrical contacting of the second support element, respectively of the electronic component is realized very advantageously in a simple manner, in particular, an integration into a circuit of the first support element being made possible. The first support element may be populated with a connecting element using comparatively inexpensive, standard component insertion methods. Angular deviations are very advantageously further reduced by decoupling the connecting elements from the fastening elements, particularly with regard to thermal expansions. It is especially preferred that the geometry of the connecting elements be specially designed to minimize the angular deviations, for example in an angular, curved and/or S-shaped form.

Another example development provides that the connecting element be fixed in position non-positively, positively and/or integrally in a third recess of the first support element, in a fourth recess of the fastening element, and/or that at least one further connecting pin of the connecting element be fixed in position non-positively, positively and/or integrally in a sixth recess of the first support element, preferably using fourth pinch ribs. The connecting elements and/or the further connecting pins are preferably press-fitted, soldered, welded and/or adhesively bonded to the first support element, the second support element and/or the fastening element. It is especially preferred that the populating process be carried out using standard component insertion methods, a comparatively precise placement and fabrication of the third recesses being able to be implemented very cost-effectively using standard methods for producing printed circuit boards.

Another example development provides that at least one connection portion of the connecting element be fixed in position non-positively, positively and/or integrally in fifth recesses of the second support element, the connection portion preferably being introduced by a receiving geometry when fitting the second support element into the fifth recesses. Thus, it is particularly advantageous that the method for installing the second support element is considerably simplified since the second support element is merely introduced into the guide portions and is subsequently automatically contacted by the connection portion due to the receiving geometry.

Another example development provides that the first and/or the second support element each include a printed circuit board and/or that the first, second and/or third pinch ribs each have an adhesive reservoir. It is especially advantageous that the adhesive reservoir accommodate the adhesive needed, thereby considerably simplifying the implementation of the adhesive bonding process.

Another object of the present invention is a method for manufacturing a support element arrangement, in a first method step, a fastening element being fixed in position in a second recess of the first support element, in a second method step, a connecting element being fixed in position in a fourth recess of the fastening element, in a third method step, the second support element being introduced into a guide portion of the fastening element, and, in a fourth method step, a connection portion of the connecting element being fixed in position in a fifth recess of the second support element. Thus, in a simple and especially cost-effective manner, it is possible to manufacture a compact support element arrangement featuring comparatively small angular deviations, the use of standard manufacturing and/or standard component insertion methods being made possible. In particular, the manufacturing of the first support element and of the second support element, as well as the populating of the first support element with the connecting element and/or the fastening element, and the populating of the second support element with the module housing and/or the electronic component being able to be realized using well known standard processes.

One example development provides that the module housing be installed on the second support element in a fifth method step, the fifth method step preferably being implemented chronologically before the third method step, and/or the particular fastening process in the first, second, third, fourth and/or fifth method step including producing a non-positive, positive and/or integral connection, in particular a soldered and/or bonded connection. It is thus particularly advantageous that the ready-populated second support element is introducible into the guide portion, so that the second support element is able to be populated in a standard component insertion process.

DETAILED DESCRIPTION OF THE INVENTION

Figure 1:
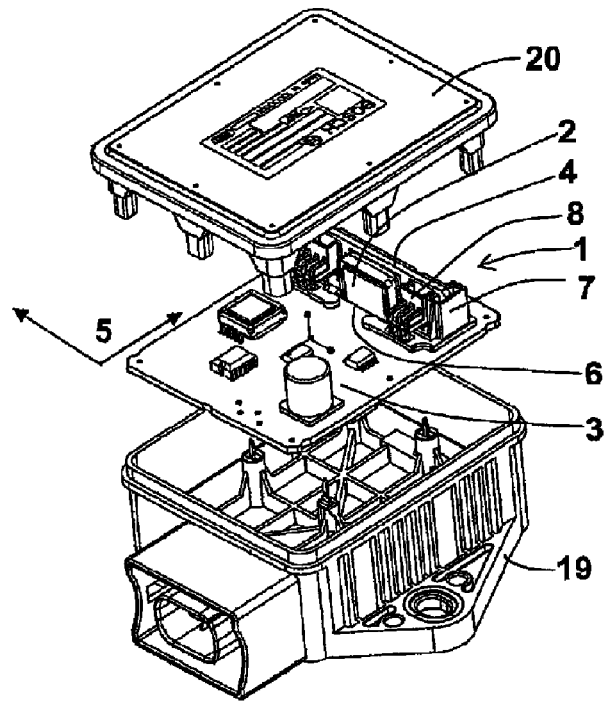
FIG. 1 shows a schematic perspective view of a support element arrangement in accordance with a first example embodiment of the present invention.

FIG. 1 shows a schematic perspective view of a support element arrangement 1 for an electronic component having a first support element 3 and a second support element 4 in accordance with an exemplary first specific embodiment of the present invention, first support element 3 being configured perpendicularly to second support element 4 and having a first main extension plane 5, and in addition, first support element 3 having a first recess 6, first recess 6 at least partially surrounding second support element 4 in first main extension plane 5. Mounted on second support element 4 is a module housing 2 having an electrical, electronic and/or microelectronic component, preferably a sensor and especially preferably an acceleration and/or rotation-rate sensor. In addition, first main extension plane 5 intersects module housing 2 and second support element 4. Moreover, second support element 4 is mechanically fastened by two fastening elements 7, which each include a fixing bracket, to first support element 3, a plurality of electrically conductive connections being realized between first and second support element 3, 4 via two connecting elements 8, which each include an angular contact. First support element 3 and second support element 4 each include, in particular, a printed circuit board or circuit board. First and/or second support element 3, 4 preferably have/has a plurality of other electrical, electronic and/or microelectronic components. Support element arrangement 1 is shown between a support-element-arrangement housing 19 for accommodating support element arrangement 1 and a support-element-arrangement housing cover 20 for covering support-element-arrangement housing 19.

Figure 2:
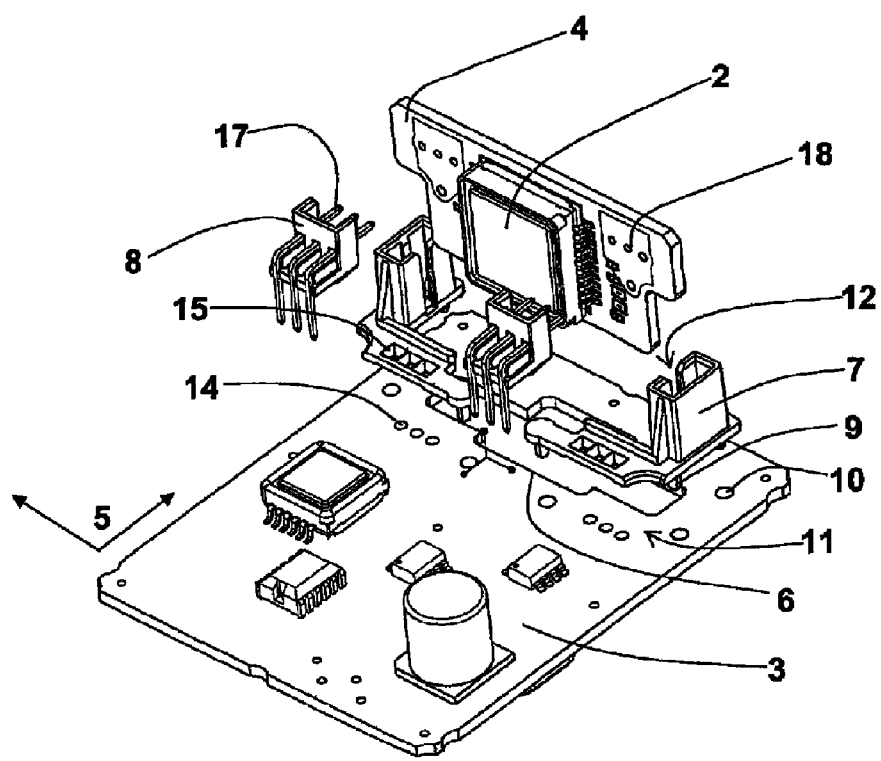
FIG. 2 shows a schematic exploded view of a support element arrangement in accordance with the first example embodiment of the present invention.

FIG. 2 shows a schematic exploded view of a support element arrangement in accordance with the first specific embodiment of the present invention, fastening elements 7 each having a plurality of connecting pins 9, which are each fixed in position in second recesses 10 of first support element 3, and first support element 3 having bearing surfaces 11 having a plurality of defined support points, which are provided, in particular, for receiving fastening elements 7 in an integral manner. In addition, fastening element 7 has a guide portion 12 for receiving second support element 4, in particular, second support element 4 being fixed in position and installed in guide portion 12 by insertion into the same in parallel to the second main extension plane of second support element 4. Connecting elements 8 are fixed in position non-positively, positively and/or integrally in third recesses 14 of first support element 3 and in fourth recesses 15 of fastening elements 7, connection portions 17 of connecting elements 8 being fixed in position non-positively, positively and/or integrally in fifth recesses 18 of second support element 4.

Figure 3:
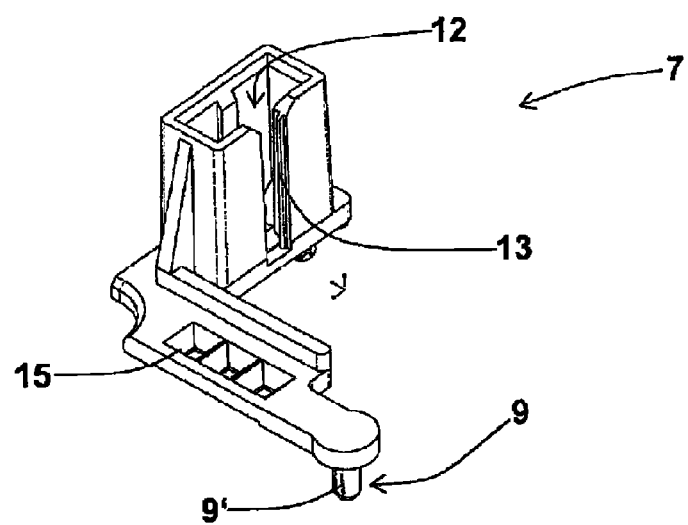
FIG. 3 shows a schematic perspective view of a fastening element of a support element arrangement in accordance with the first example embodiment of the present invention.

FIG. 3 is a schematic perspective view of a fastening element 7 of a support element arrangement 1 for an electronic component in accordance with the first specific embodiment of the present invention, connecting pin 9 having first pinch ribs 9' to be non-positively and/or positively squeezed by second recess 10, and in addition, guide portion 12 having second pinch ribs 13 for the non-positive and/or positive squeezing by second support element 4.

Figure 4:
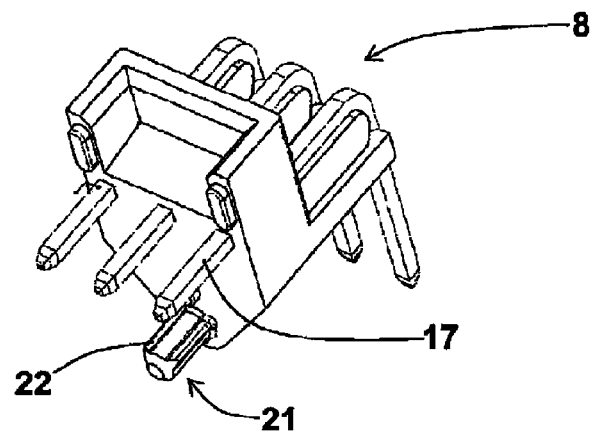
FIG. 4 shows a schematic perspective view of a connecting element of a support element arrangement in accordance with the first example embodiment of the present invention.

FIG. 4 is a schematic perspective view of a connecting element 8 of a support element arrangement 1 for an electronic component in accordance with the first specific embodiment of the present invention, connecting element 8 having another connecting pin 21 which is fixed in position in sixth recesses of first support element 3 using fourth pinch ribs 22.

Connection portion 17 is preferably introduced by a receiving geometry when fitting second support element 4 into fifth recesses 18.

What is claimed is:

1. A support element arrangement for an electronic component, comprising:
    a first support element having at least a first recess;
    a second support element configured perpendicularly to the first support element and having a first main extension plane, wherein the first recess of the first support element at least partially surrounds the second support element in the first main extension plane; and
    a module housing mounted on the second support element, wherein the module housing has at least one of an electrical, electronic and microelectronic component including a sensor;
    wherein the first main extension plane intersects at least one of the module housing and the second support element;
    wherein the second support element is mechanically fastened by at least one fastening element to the first support element, said at least one fastening element having at least one connecting pin fixed in position in a second recess of the first support element, and wherein the connecting pin has a first pinch rib configured to be squeezed by the second recess;
    wherein at least one electrically conductive connection is provided between the first support element and the second support element by a connecting element;
    wherein at least one of the first and second support elements includes a printed circuit board, and wherein the first pinch rib has an adhesive reservoir.

2. The support element arrangement as recited in claim 1, wherein the first support element has a bearing surface having at least one defined support point provided for receiving the fastening element in at least one of a positive-locking manner and integral manner.

3. The support element arrangement as recited in claim 1, wherein the fastening element has a guide portion for receiving the second support element, said guide portion having a second pinch rib configured to be squeezed by the second support element.

4. The support element arrangement as recited in claim 3, wherein at least one further connecting pin of the connecting element is fixed in position in a sixth recess of the first support element using a fourth pinch rib, and wherein at least one of the second and fourth pinch ribs has an adhesive reservoir.

5. A support element arrangement for an electronic component, comprising:
    a first support element having at least a first recess;
    a second support element configured perpendicularly to the first support element and having a first main extension plane, wherein the first recess of the first support element at least partially surrounds the second support element in the first main extension plane; and
    a module housing mounted on the second support element, wherein the module housing has at least one of an electrical, electronic and microelectronic component including a sensor;
    wherein the first main extension plane intersects at least one of the module housing and the second support element;
    wherein the second support element is mechanically fastened by at least one fastening element to the first support element, said at least one fastening element having at least one connecting pin fixed in position in a second recess of the first support element, and wherein the connecting pin has a first pinch rib configured to be squeezed by the second recess;

wherein at least one electrically conductive connection is provided between the first support element and the second support element by a connecting element;

wherein at least one of: (a) the connecting element is fixed in position in at least one of a third recess of the first support element and a fourth recess of the fastening element; and (b) at least one further connecting pin of the connecting element is fixed in position in a sixth recess of the first support element using a fourth pinch rib.

6. A support element arrangement for an electronic component, comprising:

a first support element having at least a first recess;

a second support element configured perpendicularly to the first support element and having a first main extension plane, wherein the first recess of the first support element at least partially surrounds the second support element in the first main extension plane; and a module housing mounted on the second support element, wherein the module housing has at least one of an electrical, electronic and microelectronic component including a sensor;

wherein the first main extension plane intersects at least one of the module housing and the second support element;

wherein the second support element is mechanically fastened by at least one fastening element to the first support element, said at least one fastening element having at least one connecting pin fixed in position in a second recess of the first support element, and wherein the connecting pin has a first pinch rib configured to be squeezed by the second recess;

wherein at least one electrically conductive connection is provided between the first support element and the second support element by a connecting element;

wherein at least one connection portion of the connecting element is fixed in position in a fifth recess of the second support element, the connection portion being introduced by a receiving geometry when fitting the second support element into the fifth recess.

7. A method for manufacturing a support element arrangement for an electronic component, the support element arrangement including a first support element having at least a first recess, and a second support element configured perpendicularly to the first support element and having a first main extension plane, wherein the first recess of the first support element at least partially surrounds the second support element in the first main extension plane, wherein the first main extension plane intersects the second support element, wherein the second support element is mechanically fastened by at least one fastening element to the first support element, said at least one fastening element having at least one connecting pin fixed in position in a second recess of the first support element, wherein the connecting pin has a first pinch rib configured to be squeezed by the second recess, wherein at least one electrically conductive connection is provided between the first support element and the second support element by a connecting element, wherein at least one of the first and second support elements includes a printed circuit board, and wherein the first pinch rib has an adhesive reservoir, the method comprising:

fixing, in a first method step, a fastening element in position in the second recess of the first support element;

fixing, in a second method step, a connecting element in position in a fourth recess of the fastening element;

introducing, in a third method step, the second support element into a guide portion of the fastening element; and fixing, in a fourth method step, a connection portion of the connecting element in position in a fifth recess of the second support element.

8. The method as recited in claim 7, further comprising:

prior to the third method step, installing a module housing on the second support element.

* * * * *

UNITED STATES PATENT AND TRADEMARK OFFICE
CERTIFICATE OF CORRECTION

PATENT NO.         : 8,400,772 B2                                    Page 1 of 1
APPLICATION NO.    : 12/734415
DATED              : March 19, 2013
INVENTOR(S)        : Hortig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 237 days.

Signed and Sealed this
First Day of September, 2015

Michelle K. Lee
*Director of the United States Patent and Trademark Office*